United States Patent [19]

Dean et al.

[11] 4,259,684
[45] Mar. 31, 1981

[54] PACKAGES FOR MICROWAVE INTEGRATED CIRCUITS

[75] Inventors: Douglas J. Dean, Reading; Patrick F. T. Linford, Basingstoke; John Savage, Newbury, all of England

[73] Assignee: The Secretary of State for Defence in Her Britannic Majesty's Government of the United Kingdom of Great Britain and Northern Ireland, London, England

[21] Appl. No.: 951,219

[22] Filed: Oct. 13, 1978

[51] Int. Cl.³ .................... H01L 23/02; H01L 23/12; H01L 39/02
[52] U.S. Cl. ...................... 357/74; 357/68; 357/80; 357/81; 333/247
[58] Field of Search .............. 357/74, 81, 80, 68, 357/70; 333/84 M

[56] References Cited

U.S. PATENT DOCUMENTS

| | | | |
|---|---|---|---|
| 3,479,570 | 11/1969 | Gilbert | 357/74 |
| 3,611,059 | 10/1971 | Carley | 357/74 |
| 3,715,635 | 2/1973 | Michel et al. | 357/80 |
| 3,767,979 | 10/1973 | Reber | 357/74 |
| 3,784,883 | 1/1974 | Duncan et al. | 357/81 |
| 3,886,505 | 5/1975 | Jacobson | 357/74 |
| 3,943,469 | 3/1976 | Kawamoto et al. | 357/74 |
| 3,958,195 | 5/1976 | Johnson | 333/84 M |

FOREIGN PATENT DOCUMENTS 2041392  1/1971  France ........................ 357/73

*Primary Examiner*—Andrew J. James
*Attorney, Agent, or Firm*—Pollock Vande Sande and Priddy

[57] ABSTRACT

This disclosure relates to the packaging of microwave integrated circuits (MICs) whereby an MIC is hermetically sealed within an enclosure comprising a first plate of dielectric material which carries the circuit to be enclosed, a wall of dielectric material sealed to the surface of the first plate surrounding the circuit, and a second plate of dielectric material providing a lid sealed over the wall to complete the enclosure. The first plate carries planar conductors which define at least one microwave transmission line, e.g. microstrip, extending across the wall into the enclosure from outside to provide direct microwave coupling to the enclosed circuit and thereby obviating the usual need for transitions to and from coaxial cable.

Part or all of the enclosed circuit may be contained within a recess provided by forming an aperture in the first plate and sealing a third plate of dielectric material across the aperture from below.

The disclosure describes various techniques for reducing losses where the transmission line propagation paths traverse the wall on the surface of the first plate. The entire package may be fabricated using materials and techniques compatible with those used in fabricating MIC's, for example thick film.

12 Claims, 5 Drawing Figures

PACKAGES FOR MICROWAVE INTEGRATED CIRCUITS

This invention relates to methods of packaging microwave integrated circuits (MICs) and to microwave integrated circuit packages.

When protection of integrated circuits from the harmful effects of moisture and other environmental conditions is required, it is usual to encapsulate them in hermetically sealed packages through which electrical leads—and in the case of MICs, microwave transmission lines—extend to provide electrical and/or electromagnetic coupling to the enclosed circuit. In the particular case of MICs, this packaging typically comprises a hollow machined metal enclosure, microwave coupling to the enclosed MIC being achieved by means of coaxial transmission lines extending through the metal walls of the package, which walls also serve to electromagnetically screen the circuit. Apart from being relatively larger and heavier than the enclosed MIC, and expensive to manufacture, these metal enclosures have a number of disadvantages. The coupling together of a number of such metal-packaged MICs requires coupling from an integrated circuit transmission line, such as microstrip, to a coaxial transmission line and back again. On the other hand, to avoid this problem a number of MICs may be enclosed in a common metal package so that coupling between them can be made using standard integrated circuit techniques such as tape bonding. However, the resulting increase in the package size increases the problem of sealing, and failure of one of the MICs would require the replacement of a larger and therefore more costly unit than would otherwise be the case.

According to the present invention, a method of hermetically packaging an integrated circuit carried by a first plate of dielectric material comprises sealing a wall of dielectric material to the surface of the first plate surrounding the circuit, and sealing a second plate of dielectric material over the wall whereby to provide a hermetic enclosure for the circuit, the first plate of dielectric material also carrying planar conductors which define at least one integrated circuit microwave transmission line which extends under the wall into the enclosure from outside, and which is coupled with the enclosed circuit.

The term integrated circuit microwave transmission line is intended to include all forms of microwave transmission line compatible with microwave integrated circuit technology, including microstrip, co-planar waveguide, slot-line and tri-plate.

The method provides microwave integrated circuit packages in which direct microwave coupling to the enclosed circuit can be made from outside the enclosure without the need for the usual transition from a microwave integrated circuit transmission line to coaxial cable and back again. The package can be fabricated using techniques and materials compatible with those used in the fabrication of the transmission lines and the circuit elements.

Where the conductor of the or each transmission line which defines the microwave propagation path is carried on the face of the said first plate to which the wall is sealed (eg, microstrip), the change in the characteristic impedance of that transmission line as it traverses the wall may be reduced by a variation in the width of the transmission line propagation path in the region underlying the wall.

This variation in the transmission line propagation path width may be an abrupt step-function variation in register with the sides of the wall, although a smooth or progressive increase or decrease in width, as appropriate on both sides of the wall, may effectively reduce losses.

The elements of the enclosed circuit may all be formed on or bonded to the same surface of the first plate as that to which the wall is sealed, ie, the first plate provides the substrate for the microcircuit. Alternatively part or all of the enclosed circuit may be contained within a recess provided by forming an aperture in the first plate of dielectric material, and sealing a third plate of dielectric material to the surface of the first plate surrounding the aperture, on the opposite side to that to which the wall is sealed.

This latter arrangement enables various circuit elements to be pretested before insertion into the circuit, permits the use of circuit elements formed on or bonded to different substrate materials from that of the first plate, eg, of ferrimagnetic material or metallic heat sinks, and enables a common package configuration to be used for different circuit designs.

For example, in a preferred microstrip implementation of this latter arrangement, the facing surfaces of the first and third plates of dielectric material are each formed with a continuous layer of conductor to provide the ground plane conductor, and the conductor strip defining the or each transmission line propagation path is formed on the opposite face of the first plate, extending outwardly across this face away from the edge of the recess. The ground plane conductor thus extends across the floor of the recess into which elements, eg, individual microwave active devices, and microstrip substrates containing distributed microwave components, can be conductively bonded and then coupled to one another, and to the microstrip conductor strip or strips carried on a second plate using standard techniques. The above-mentioned change in the characteristic impedance of the or each transmission line as it traverses the wall may then be compensated by a reduction in the width of the conductor strip in the region underlying the wall, and each strip may be tapered towards the wall on either side to avoid introducing impedance discontinuities.

Alternatively, or in addition to the above-mentioned variation in propagation path width, the change in the characteristic impedance of the or each transmission line as it transverses the wall may be made less abrupt by forming over the transmission line propagation path, a dielectric overlay progressively increasing the thickness towards the wall on both sides. Where such an overlay is provided in addition to a progressive variation in the width of the transmission line propagation path, the overlay preferably coincides with the progressively narrowing or widening portions thereof in such manner as to maintain the characteristic impedance of the transmission line substantially constant as it traverses the wall.

In addition to, or as an alternative to providing an overlay of this kind, sharp impedance discontinuities in the transmission line may also be reduced by arranging the transmission line to traverse the wall obliquely.

To improve the dissipation of heat generated by the microwave circuit enclosed within the package, a plate of high thermal conductivity material, eg, copper, may be secured in thermal contact with the external face of the first plate of dielectric material (or the third plate, where one is provided). This thermally conducting plate may also conveniently be used to support one or more (adjustable) tuning magnets of known kind for magnetizing appropriate areas of a ferrimagnetic material enclosed in the package to provide non-reciprocal microwave components such as microstrip circulators.

The enclosed microwave circuit may be electromagnetically screened by providing conductive layers on appropriate surfaces of the dielectric elements of the package, either internally or externally of the enclosure. Additionally, where such screening is provided externally of the enclosure, an internal layer of resistive material may be provided to absorb microwave energy and damp out currents induced in the screening conductors.

Microwave integrated circuit packages in accordance with the present invention may be fabricated using conventional thick film integrated circuit techniques and materials. In a preferred form, the package is fabricated using alumina as the dielectric plate material although in some cases, it may be advantageous to make part of the package of beryllia owing to its higher thermal conductivity.

The invention will now be described in greater detail, by way of example only, with reference to the accompanying drawings of which:

Figure 1:
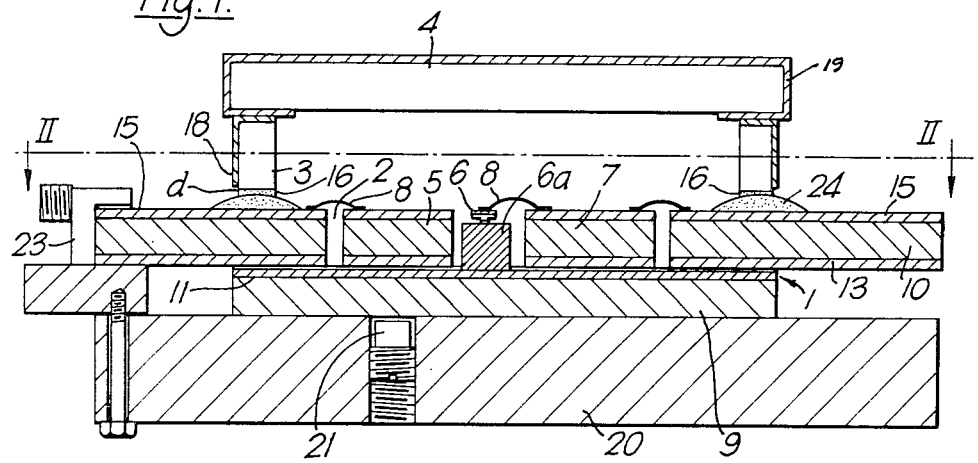
FIG. 1 is a diagrammatic cross-sectional view of a microwave integrated circuit package in accordance with the invention.
Figure 2:
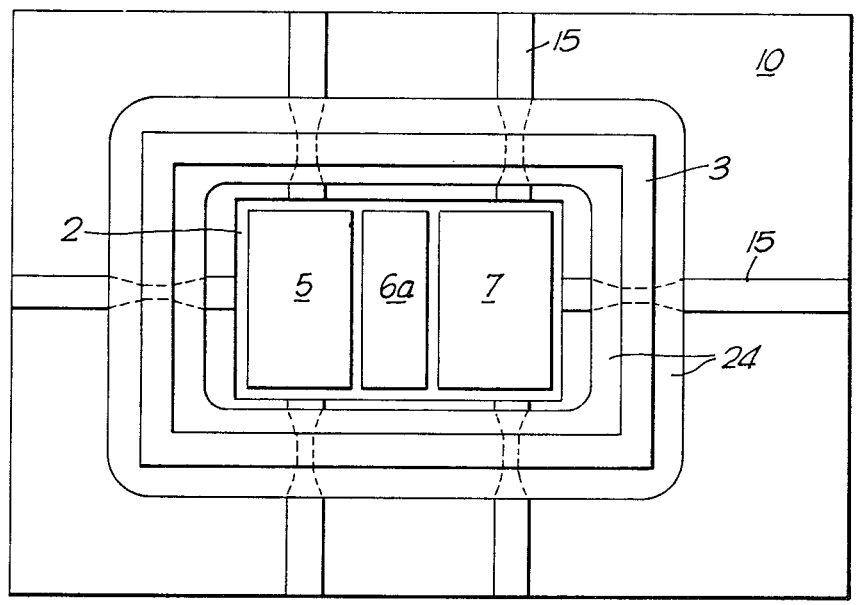
FIG. 2 is a plan view along the line II—II of the package shown in FIG. 1.

Referring to FIGS. 1 and 2 of the drawings, the package comprises a base 1 having a rectangular recess 2 surrounded by a "window-frame" wall 3 and covered by a lid 4 supported by the wall. The wall 3 is sealed to the base 1 and the lid 4 is sealed to the wall 3 to provide a hermetically sealed enclosure for elements 5, 6, 7 of a microwave integrated circuit (MIC) mounted in the recess 2.

The recessed base 1 is formed from two plates 9, 10 of dielectric ceramic material, alumina (635 μm thick) in this example. The plate 9 is formed on its upper face with a continuous metallization layer 11 of, eg platinum/gold alloy, and the plate 10 has a central rectangular aperture which may be pressed out from it, before it is fired, or machined out after firing. Plate 10 is also formed on its lower face with a similar continuous metallization layer 13 to which the upper metallized face of the plate 9 is sealingly soldered over the aperture, to define the recess 2.

The metallization layer 13 formed on the lower surface of the plate 10 provides the ground plane for a plurality (6) of microstrip conductor strips 15 formed on its upper face, and extending between the edge of the aperture or recess 2 and the periphery of the plate 10.

The rectangular window-frame wall 3 is also of alumina, and is sealed across the upper face of the plate 10 by a glass seal 16 of a known kind. For screening purposes, the external and upper surfaces of the wall 3 are formed with a conducting metallization layer 18 which is electrically isolated by a small gap d from each of the conductor strips 15. The lid 4, which also comprises a plate of alumina, is also screened on its upper surface, around its edge and around the margin of its lower surface, with a conducting metallization layer 19. The internal surfaces of the lid 4, and of the wall 3 where necessary, may also be coated with a layer of resistive material for absorbing microwave energy and damping any currents induced in the screening metallization. The metallized margin of the lid's lower surface is soldered to the metallized upper surface of the wall 3 to completely seal the enclosure. This final sealing operation can thus be carried out at a relatively low temperature to avoid damage to the enclosed circuit elements. The height of the wall must be sufficient to ensure the screening metallization does not greatly interact with the microwave circuitry, or sufficient to ensure that the interaction effects can be taken into account at the design stage. In the present example, the width of the strips 15 is about 635 μm, and the wall height is about 2.5 mm, ie about 4 times the plate thickness.

In this microstrip implementation of the invention, the ground plane metallization 13 of the apertured alumina plate 10, in combination with the conductor strips 15 provide a plurality of microwave transmission lines extending into the hermetically sealed enclosure from outside, the strips 15 defining the microwave propagation paths thereof. The metallized floor 11 of the recess 2 is electrically continuous with the microstrip ground plane metallization 13 and provides an electrically conducting grounded surface to which the ground plane conductors of individual microstrip substrates or microwave semi-conductor devices can be directly bonded, using solder for example. For illustrative purposes only, the package is shown housing two such microstrip substrates 5,7 and a semi-conductor diode 6 mounted on a copper block 6a. One of the substrates 7 is of alumina, the same dielectric material as the package, while the other substrate 5 is of ferrimagnetic material, for providing non-reciprocal components such as circulators and isolators in known manner. Both substrates 5,7 are of the same thickness as the alumina plate 10 so when in position, their upper surfaces are co-planar with the upper surface of the plate 10 to facilitate coupling between the conductors carried on these surfaces, for example, by tape bonding (shown only in FIG. 1). The diode 6 is mounted active region down onto the copper block 6a for heat dissipation purposes. The copper block also raises the level of the active device's upper contact to that of the upper faces of adjacent substrates 5,7 again to facilitate bonding.

Heat generated by the enclosed MIC is dissipated through the plate 9 to which the circuit components are bonded. To improve thermal dissipation, this plate may be of beryllia which has a higher thermal conductivity. Alternatively, or additionally, a heat-sink in the form of a metal plate 20 may be held, eg, by mechanical clamping, against the outer surface of the plate 10 preferably with a thin layer of thermally conducting grease, sandwiched between them. This heat sink plate 20 also provides means for mounting (screw adjustable) tuning magnets 21 for magnetizing appropriate regions of the ferrite substrate 5 to provide non-reciprocal microwave components such as circulators, etc.

The metal plate 20 is mechanically clamped to the package by means of metallic blocks 23 which are fixed to the edge of the plate 10. In the present example these metallic blocks conveniently also provide support for microwave coaxial couplers as shown schematically only in FIG. 1.

The microstrip conductor strips 15 encounter a change in the dielectric constant of the overlying medium as they traverse the wall 3, giving rise to a sharp decrease in the characteristic impedance of the transmission lines in this region. To compensate for this the strips 15 are of suitably reduced width in the region underlying the wall; and to reduce losses which might otherwise result from an abrupt change in width, the strips 15 are smoothly tapered towards this region of reduced width. Additionally, the abruptness of the change in the characteristic impedance of the transmission lines due to the wall 3 may also be reduced by forming, on top of the strips 15, a dielectric overlay 24 to provide a dielectric loading which progressively increases in thickness towards the wall 3 on both sides.

Figure 3:
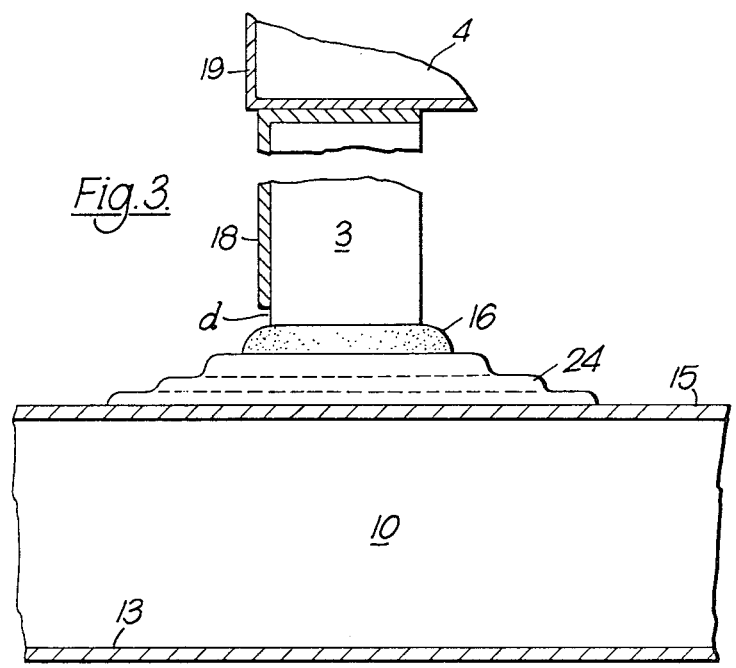
FIG. 3 shows on an enlarged scale a detail of the package shown in FIG. 1.

As shown in FIG. 3, the overlay 24 is formed from three superimposed layers of dielectric material having a dielectric constant matched with that of the wall and deposited using conventional thick film techniques. Each overlay layer corresponds in its general shape to a projection of the wall, successive layers being of reducing width to provide an overall thickness which progressively increases towards both sides of the wall. Each layer is typically fabricated by forming a fused vitreous closed-loop track using an alumina-loaded zero-flow glaze paste, successive layers being deposited after heat-fusion of the preceding layer. The parts of overlay 24 which progressively increase in thickness coincide with the tapering regions of the strips 15 so as to maintain the impedance of the microstrip transmission lines substantially constant as they traverse the wall 3.

Figure 4:
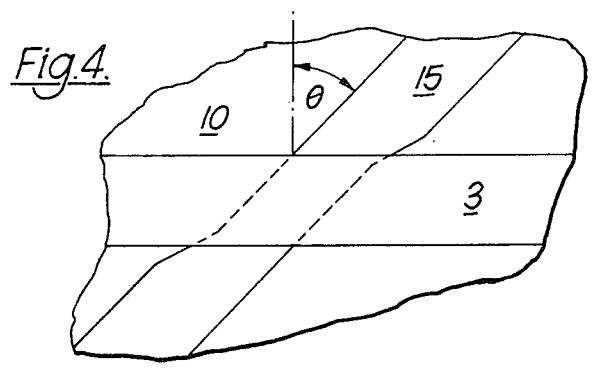
FIG. 4 is a detail of part of a modified MIC package in accordance with the invention.

The effects of sharp discontinuities in the characteristic impedance of the transmission lines may also be reduced by arranging the conductor strips 15 to traverse the wall 3 obliquely, as shown in FIG. 4 to produce a similar gradual effect. This technique may be used as an alternative to, or in addition to the overlay technique.

In the fabrication of the package, the microstrip conductors and screening metallizations are first formed as appropriate on the various alumina elements 3,4,9 and 10 using conventional thick film fabrication techniques, and the overlay layers are then fabricated. The window-frame wall 3 is then sealed to the surface of the uppermost overlay layer 24 using a glass seal 16, these operations being carried out first because they require temperatures which may damage the enclosed circuit. The metallized surface of the plate 9 can then be bonded to the ground plane metallization 13 of the plate 10 using high temperature solder. The individual microstrip substrates 5,7 and solid state devices 6 mounted on copper blocks 6a, may then be bonded to the metallised floor of the recess 2 using solder or conductive epoxy bonding, and these then coupled to one another, and to the conductor strips 15 using tape bonding. The circuit may then be tested, and any defects corrected, before the enclosure is finally completed by sealing the lid 4 to the wall 3 using solder.

The metal plate 20 is then clamped in position, conveniently employing means provided by coaxial or other microwave transmission line connectors or couplers coupled to the package; and any non-reciprocal circuit components may then be tuned by adjustment of appropriately positioned tuning magnets 21 carried by the plate 20.

Figure 5:
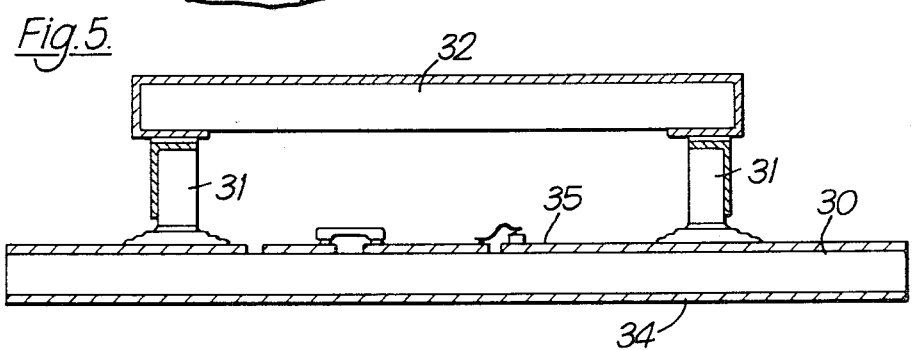
FIG. 5 is a diagrammatic cross-sectional view of another modified form of MIC package in accordance with the invention.

FIG. 5 shows a simplified form of microwave integrated circuit package in accordance with the invention in which the base of the package comprises a single ceramic substrate plate 30 which itself provides the supporting substrate for all the elements of the enclosed microwave integrated circuit. The circuit is hermetically enclosed as before, by a ceramic window-frame wall 31 sealed to the surface of the plate 30 surrounding the circuit, and sealed with a lid provided by a ceramic plate 32 covering the wall in exactly the same manner as above.

The plate 30 is formed on its lower face with a ground plane conductor metallization 34, and on its upper face with a conductor metallization pattern 35 including conductor strips which interconnect elements of the circuit and provide microstrip transmission line propagation paths which traverse the wall 31 to provide direct microwave coupling to the enclosed circuits from outside the enclosure.

The same techniques as described above may be used to compensate for the sudden change in the characteristic impedance of these transmission lines as they traverse the wall, and thereby reduce losses.

For either of the above package configurations the circuit may comprise thick film micro-circuit elements formed on the surface of the main plate (10,20) by screen printing in conventional manner, together with non-printed components, such as individual semiconductor active devices, inserted into the printed circuitry by bonding at appropriate circuit locations. Where desirable, some or all of the circuit elements, and the conductor metallizations may be formed using thin film fabrication techniques as mentioned earlier.

The package may of course be electromagnetically coupled to other similar microwave packages, or the main plate 10,30 may carry more than one hermetically enclosed MIC of the kind described above, the circuits being coupled to one another by integrated circuit transmission lines provided on the plate. The apertured plate 10 may also provide a substrate for additional integrated circuitry within or external to the sealed enclosure or enclosures. Furthermore, more than one recess may be provided within a common enclosure.

The screening metallization of the package, or part of it, may be provided within the enclosure where desirable.

Depending on the degree of hermeticity required, the lid of the package may be sealed over the wall using means other than solder bonding providing that the sealing operation is carried out at a sufficiently low temperature to avoid damaging the enclosed circuit. For example, where a high degree of hermeticity is not essential, epoxy bonding may be used.

Although the invention has been described in its preferred, microstrip implementation, it is envisaged that the invention may also be implemented using other forms of integrated circuit microwave transmission line, such as co-planar waveguide, slot-line or tri-plate.

I claim:

1. In a microwave integrated circuit package for housing a microwave integrated circuit, said package being of the type comprising a first plate of dielectric material for at least indirectly supporting a microwave integrated circuit, a wall of dielectric material sealed to the surface of the first plate, and a second plate of dielectric material providing a lid for sealing over the wall to provide a hermetic enclosure for elements of a microwave integrated circuit supported by the first plate, the first plate of dielectric material carrying planar conductors which define at least one microwave transmission line which extends into the enclosure from outside for coupling to the enclosed circuit elements, the conductors which define the propagation path for each said transmission line being carried on the surface of the first plate to which the wall is sealed, the improvement wherein the package includes impedance compensating means on both sides of the wall for compensating in a smoothly or progressively varying manner changes in the impedance of the transmission line as it traverses the wall such that the characteristic impedance of the transmission line remains constant or varies smoothly or progressively as it traverses the wall.

2. A microwave integrated circuit package as claimed in claim 1 wherein the change in the characteristic impedance of each said transmission line is reduced as it traverses the wall by a reduction in the width of the associated conductor in the region underlying the wall, and said impedance compensating means comprises a smooth or progressive reduction in the width of the said conductor towards said region of reduced width.

3. A microwave integrated circuit package as claimed in claim 2 wherein said impedance compensating means further includes dielectric loading material overlying the conductor portions of progressively or smoothly reducing width on either side of the wall, the thickness of the loading material increasing progressively with the reducing conductor width towards the wall, such as to maintain the characteristic impedance of the transmission line substantially constant as it traverses the wall.

4. A microwave integrated circuit package as claimed in claim 1 wherein said impedance compensating means comprises dielectric material overlying the associated propagation path-defining conductor adjacent both sides of the wall and progressively increasing in thickness towards the wall.

5. A microwave integrated circuit package as claimed in claim 3 or 4 wherein said dielectric loading material is formed of a plurality of successive superimposed layers of dielectric material generally corresponding in shape to a projection of the wall on the surface of the first plate of dielectric material, the wall being sealed to the surface of the uppermost one of said layers, and the layers successively superimposed on said uppermost layer being of progressively decreasing width so that the overall thickness of the loading material overlying said transmission line progressively increases towards both sides of the wall.

6. A microwave integrated circuit package as claimed in claim 5 wherein each of said layers of dielectric material comprises a dielectric-vitreous paste which, after application, has been fired to form a fused dielectric layer having a dielectric constant approximating to that of the material of the wall.

7. A microwave integrated circuit package as claimed in claim 1, 2, 3 or 4 wherein each said transmission line traverses the wall obliquely.

8. A microwave integrated circuit package as claimed in claim 1 wherein the mating surfaces of the dielectric wall and the second plate of dielectric material are formed with a metallic coating, and are sealed together by solder bonding.

9. A microwave integrated circuit package as claimed in claim 8 wherein the metallic coating extends over substantially the entire external surfaces of the wall and the second plate of dielectric material to provide electromagnetic screening for the enclosed circuit.

10. A microwave integrated circuit package as claimed in any one of claims 1 to 4, 8 or 9 including elements of a microwave integrated circuit housed within the hermetic enclosure and electrically coupled to the transmission line within the enclosure.

11. A microwave integrated circuit package as claimed in claim 10 wherein the enclosed circuit elements are all disposed on the same surface of the first plate as that to which the wall is sealed.

12. A microwave integrated circuit package as claimed in any one of claims 1 to 4, 8 or 9 including a third plate of dielectric material, the first plate having an aperture, and the first and third plates providing a base formed by sealing the third plate over the aperture to provide a recess in the base in which at least one of the elements of a microwave integrated circuit can be mounted before sealing the enclosure by means of said wall surrounding the recess and the second plate of dielectric material, the adjacent surfaces of the first and third plates of dielectric material each being formed with a continuous metallization layer, that formed on the first plate providing a ground plane conductor for each said transmission line, and that formed on the third plate providing a conducting floor for the recess electrically continuous with the ground plane conductor.

* * * * *